United States Patent [19]

Guajardo

[11] Patent Number: 4,647,794
[45] Date of Patent: Mar. 3, 1987

[54] SOLID STATE RELAY HAVING NON OVERLAPPING SWITCH CLOSURES

[75] Inventor: Ciro Guajardo, Harbor City, Calif.
[73] Assignee: Teledyne Industries, Inc., Los Angeles, Calif.
[21] Appl. No.: 737,033
[22] Filed: May 22, 1985
[51] Int. Cl.$^4$ .................. H03K 3/42; H03K 17/687; G02B 27/00
[52] U.S. Cl. .................. 307/311; 307/270; 307/570; 250/551
[58] Field of Search .......... 307/270, 311, 254, 570; 330/264; 250/551

[56] References Cited

U.S. PATENT DOCUMENTS

| | | | |
|---|---|---|---|
| 4,313,065 | 1/1982 | Yoshida et al. | 330/264 |
| 4,317,081 | 2/1982 | Kobayashi | 307/300 |
| 4,390,790 | 6/1983 | Rodriquez | 307/311 |
| 4,408,137 | 10/1983 | Fox | 307/471 |

FOREIGN PATENT DOCUMENTS 099100  1/1984  European Pat. Off. .

Primary Examiner—Stanley D. Miller
Assistant Examiner—B. P. Davis
Attorney, Agent, or Firm—Karon, Morrison & Savikas

[57] ABSTRACT

A solid state relay circuit is provided which controls the application of power to multiple loads in a manner which prevents the simultaneous application of power to more than one load. Photovoltaic diode arrays along with phototransistors are employed to control MOSFET output switching devices.

1 Claim, 3 Drawing Figures

SOLID STATE RELAY HAVING NON OVERLAPPING SWITCH CLOSURES

BACKGROUND OF THE INVENTION

This invention relates to solid state relays and, more particularly, to circuits for providing power to multiple loads in a non-overlapping fashion in order to simulate the break-before-make contact configuration of an electromechanical relay.

Over the years, a wide variety of solid state relays have been developed to control the application of power to a load. Recently, metal oxide semiconductor field effect power transistors (MOSFETs) have been used as output switching devices in these types of circuits. Some of these circuits employ light emitting diodes optically coupled to photovoltaic diode arrays which control the MOSFET. Examples of circuits of this type are disclosed in copending United States patent application Ser. No. 627,808, filed July 5, 1984, entitled Current Overload Protected Solid State Relay, and assigned to the assignee of the present invention.

For the most part, prior art solid state relay circuits are limited to a single output switch closure in response to the application of a control signal. This configuration is analogous to an electromechanical relay having a single-pole-single-throw, normally open contact.

While it is desirable to provide a solid state relay having an output switch configuration analogous to that of a single-pole-double-throw, break-before-make mechanical contact, such devices have been difficult to construct. One of the controlling factors in the design of a solid state relay of this type is the response time of the output switching device. This is so for the following reasons.

In a break-before-make contact configuration, one contact pair opens before the other contact pair closes, so that there is no overlap of switch closures. In order to implement this configuration using two solid state switches, it is necessary that one of the switches be fully off before the other switch is turned on.

To meet the above criteria when using MOSFETs as output switching devices poses a particularly difficult problem. This is so because the high gate to source resistance and capacitance associated with MOSFETs generally yields devices in which the turn-off time is substantially longer than the turn-on time. This characteristic leads to the overlapping of switch closures when two MOSFETs are operated in alternating fashion.

Accordingly, it is an object of the present invention to provide a new and improved solid state relay.

It is another object of the invention to provide a solid state relay having multiple output switching circuits.

It is yet another object of the invention to provide a solid state relay having multiple output switching circuits which operate without overlapping switch closures.

SUMMARY OF THE INVENTION

The foregoing and other objects of the invention are accomplished by a control circuit including first and second metal oxide semiconductor power field effect transistors (MOSFETs), each having gate, drain and source terminals. A first bias circuit provides a first bias signal in response to the application of an input signal to the circuit, while a second bias circuit provides a second bias signal in response to the absence of the input signal.

A first shunt circuit provides a first current path in response to the application of the input signal to the circuit, while a second shunt circuit provides a second current path in response to the absence of the input signal. The first bias signal is provided to the first MOSFET to bias it into conduction, and the second bias signal is provided to the second MOSFET to bias it into conduction.

The first bias circuit is connected to the second MOSFET so that upon the application of the input signal, the first current path discharges the second MOSFET input capacitor sufficiently rapidly to ensure that the second MOSFET is switched off before the first MOSFET is biased into conduction. In like manner, the second bias circuit is connected to the first MOSFET so that upon the absence of the input signal, the second current path discharges the first MOSFET input capacitor sufficiently rapidly to ensure that the first MOSFET is switched off before the second MOSFET is biased into conduction.

Other objects, features and advantages of the invention will become apparent by reference to the specification taken in conjunction with the drawings in which like elements are referred to by like reference designations throughout the several views.

DESCRIPTION OF THE PREFERRED EMBODIMENT

Figure 1:
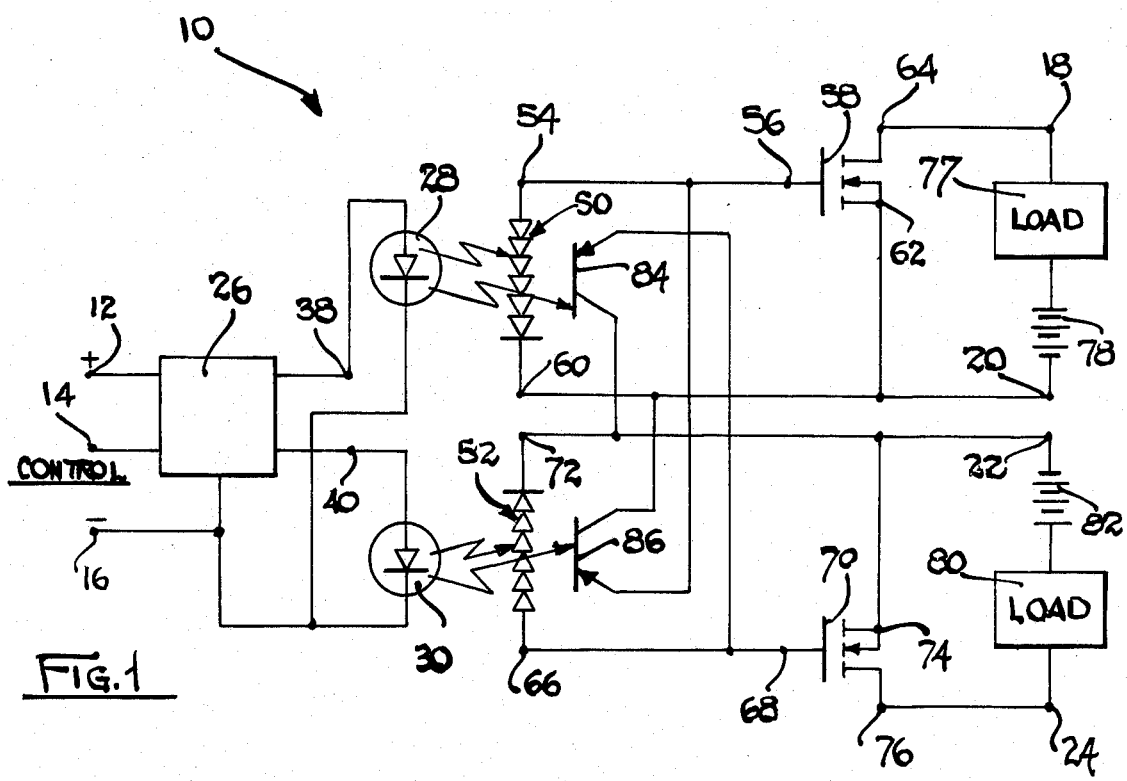
FIG. 1 is a schematic diagram showing a first embodiment of the invention.

Referring to FIG. 1, there is shown a solid state relay circuit 10 constructed in accordance with a first embodiment of the invention. The circuit 10 includes three input terminals 12, 14 and 16, and four output terminals 18, 20, 22, and 24. The terminals 12, 14 and 16 are connected to a light emitting diode (LED) control circuit 26 designed to control the operation of LEDs 28 and 30 as follows. Terminals 12 and 16 are designed to be connected to the positive and negative terminals, respectively, of a direct current power source which furnishes a constant source of power used to illuminate the LEDs 28 and 30. When a control signal in the form of a positive voltage is applied between control terminal 14 and terminal 16, the circuit 26 causes LED 30 to emit light and deenergizes LED 28. In the absence of a control signal at terminal 14, the circuit 26 causes LED 28 to emit light, and deenergizes LED 30.

Figure 2:
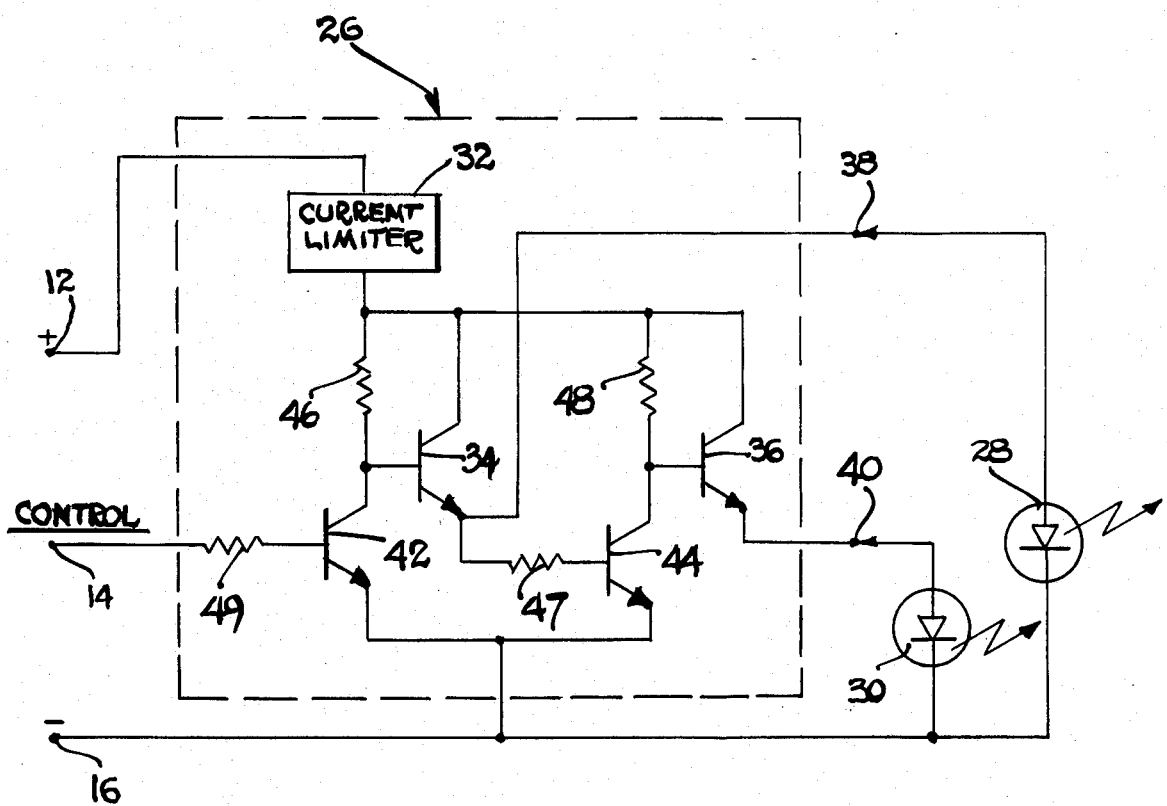
FIG. 2 is a schematic diagram showing a driver circuit used to control two light emitting diodes in accordance with the teachings of the invention.

A typical circuit for implementing the functions of control circuit 26 is shown in FIG. 2. A current limiter 32, which may be in the form of a resistor or a constant current source, is connected between the terminal 12 and the collector terminals of transistors 34 and 36. The emitter terminals of transistors 34 and 36 are connected, respectively, to the anodes of LEDs 28 and 30 using terminals 38 and 40.

The base terminals of the transistors 34 and 36 are connected, respectively, to the collector terminals of transistors 42 and 44, the emitter terminals of which are connected in common to the terminal 16 and the cathodes of the LEDs 28 and 30. Resistors 46 and 48 are connected between the base and collector terminals of transistors 34 and 36, respectively. Resistor 49 is connected between the emitter terminal of transistor 34 and the base terminal of the transistor 44. Resistor 52 is connected between the terminal 14 and the base terminal of the transistor 42.

The operation of the circuit 26 described above is as follows. Upon application of a control signal at terminal 14, transistor 42 conducts, switching off transistor 34 and, in turn, transistor 44. With transistor 34 non-conducting, LED 28 is deenergized. With transistor 44 non-conducting, resistor 48 biases transistor 36 into conduction, supplying current through limiter 32 to LED 30, causing it to emit light.

Upon removal of the control signal from the terminal 14, transistor 42 switches off, permitting resistor 46 to bias transistor 34 into conduction, thus supplying current through limiter 32 to LED 28. With transistor 34 conducting, transistor 44 is also biased into conduction, causing transistor 36 to switch off, thus deenergizing LED 30.

Returning to FIG. 1, LEDs 28 and 30 are positioned, respectively, adjacent to and optically coupled with photodiode arrays 50 and 52. The arrays 50 and 52 each include a plurality of photodiodes connected in series to form a photovoltaic voltage source. It is well known to those skilled in the art that a photodiode will produce a voltage and a current (approximately one half a volt at about three microamperes for a small area silicon diode) in response to light impinging on the surface thereof. The amount of current available from a particular photodiode is proportional to the amount of light impinging on its surface.

By connecting in series a plurality of photodiodes, the voltages generated by each are added to produce a desired voltage level at the output terminals of the array. In the preferred embodiment, sixteen photodiodes are connected in series in each array 50, 52 to produce an output voltage of about eight volts at a current level of about three microamperes in response to light from the LEDs 28 and 30, respectively. The number of LEDs used to illuminate the arrays is a matter of design choice. The arrays 50, 52 are typically fabricated as integrated circuit devices using manufacturing techniques such as dielectric isolation which are well known to those skilled in the art.

Positive terminal 54 of the array 50 is connected to the gate terminal 56 of an N-channel, enhancement mode metal oxide semiconductor field-effect power power transistor (MOSFET) 58. Negative terminal 60 of the array 50 is connected to the source terminal 62 of the MOSFET 58, and the drain and source terminals 64 and 62 of the MOSFET 58 are in turn connected, respectively, to the circuit output terminals 18 and 20.

Power MOSFET's are characterized by their ability to switch several amperes of current between their output (drain and source) terminals from a power source of up to several hundred volts. These devices exhibit low output resistance in the on, or conducting, state (typically one-one hundredth to three ohms) and exhibit high output resistance in the off, or non-conducting, state (typically one to ten megohms). A typical MOSFET device for use in the invention is type number IRF520, supplied by International Rectifier, El Segundo, Calif.

A MOSFET is biased into full conduction by the application of a first level of voltage (typically six to eight volts) between the gate and source terminals. The first level of voltage is referred to as the turn-on voltage of the MOSFET. When the gate to source voltage is below a second level of voltage (typically 3 volts) the MOSFET is biased into a non-conducting state. This second level of voltage is referred to as the turn-off voltage of the MOSFET.

Positive terminal 66 of the array 52 is connected to the gate terminal 68 of a second MOSFET 70 similar in construction to that of MOSFET 58. Negative terminal 72 of the array 52 is connected to the source terminal 74 of the MOSFET 70, and the drain and source terminals 76 and 74 are in turn connected, respectively, to the circuit output terminals 24 and 22.

The operation of the circuit 10 as discussed thus far is as follows. A voltage source is connected between input terminals 12 and 16 as discussed above. In the absence of a control signal at terminal 14, LED 28 is energized and LED 30 is deenergized by circuit 26. The light emitted by LED 28 is optically coupled to the diode array 50 which causes it to produce a voltage across the gate and source terminals 56 and 62 of the MOSFET 58. The MOSFET 58 is biased into full conduction, providing a low impedance current path across the output terminals 18 and 20. When the MOSFET 58 is conducting, power is applied to a load 77 from a power source 78. The load 77 and the source 78 are connected in series across the terminals 18 and 20 as shown in FIG. 1.

Upon the application of a control signal to terminal 14, LED 28 is deenergized, and LED 30 is energized by circuit 26. Since LED 28 no longer emits light, the voltage provided by the array 50 drops to zero, and the MOSFET 58 turns off. The light emitted by LED 30, however, is optically coupled to the array 52 which causes it to produce a voltage across the gate and source terminals 68 and 74 of the MOSFET 70. The MOSFET 70 is thus biased into full conduction providing a low impedance current path across the output terminals 22 and 24. When the MOSFET 70 is conducting, power is applied to a load 80 from a power source 82.

Upon subsequent removal of the control signal from terminal 14, MOSFET 70 turns off and MOSFET 58 turns on. In order to avoid the simultaneous application of power to loads 77 and 80, it is necessary that the turn off time of MOSFET 58 be less than the turn on time to MOSFET 70; and that the turn off time of MOSFET 70 be less than the turn on time of MOSFET 58.

Due to the high gate to source input impedance of MOSFETs, a relatively small amount of gate bias current is required to turn on these devices. However, the construction of a power MOSFET device necessitates the use of a large gate surface area. This large area forms a relatively large capacitor (hereinafter referred to as the input capacitor) between the gate and source terminals. The value of this capacitor typically ranges from about 450 picofarads to over 1,000 picofarads.

The high input capacitance of the MOSFET significantly effects its switching response time. The time required to turn on the MOSFETs 58, 70 (referred to as the turn-on response time) is a function of several variables including the current from the arrays 50, 52, and the turn on voltage and the input capacitance of the MOSFETs. Using typical values for these variables, the turn-on response time of the MOSFETs 58, 70 in the circuit described thus far is about nine hundred microseconds.

When the voltage provided by one of the arrays 50, 52 drops to zero, the input capacitor of the corresponding MOSFET 58, 70 begins to discharge. The MOSFET remains conducting until the input capacitor discharges to a voltage below the turn off voltage level. The discharge path for the input capacitor is essentially the gate to source input impedance of the MOSFET. Since this impedance is very high in value (typically one hundred megohms or more) the input capacitor discharges at a slow rate. Accordingly, the MOSFET remains conducting for a long interval of time (typically several minutes or more).

One way to decrease the turn-off time of the MOSFET is to connect a shunt resistor between its gate and source terminals to provide a rapid discharge path for the MOSFET input capacitor. However, connecting a resistor in this manner has the effect of increasing the turn-on time of the MOSFET because a significant portion of the current provided by the array is shunted away from the gate to source junction of the MOSFET. For example, it has been found that the use of a five megohm shunt resistor provides a turn-off time of about 2.5 milliseconds while increasing the turn on time of the MOSFET from nine hundred microseconds to about one and one half milliseconds.

The control circuit 10 of the present invention provides for rapid turn-off of the MOSFETs 58, 70 without materially affecting their turn-on time. Referring again to FIG. 1, a PNP bipolar phototransistor 84 is provided having emitter and collector terminals which are connected, respectively, to the gate and source terminals 68, 74 of the MOSFET 70. A second PNP bipolar phototransistor 86 is provided having emitter and collector terminals connected, respectively, the the gate and source terminals 56, 62 of the MOSFET 58.

Phototransistor 84 is positioned along with arrays 50 adjacent to and optically coupled with LED 28. Phototransistor 86 is positioned along with array 52 adjacent to and optically coupled with LED 30. Consequently, when LED 28 emits light, along with causing array 50 to generate a voltage, the light causes phototransistor 84 to conduct, providing a low impedance path between its emitter and collector terminals. This low impedance path appears across the input capacitor of the MOSFET 70, causing the capacitor to discharge extremely rapidly. This in turn, causes MOSFET 70 to switch off in a short interval of time (about ten to fifty microseconds).

In like manner, the phototransistor 86 is positioned, along with the array 52, adjacent to and optically coupled with LED 30. Light emitted from LED 30 not only causes array 52 to generate voltage but also causes phototransistor 86 to conduct, providing a low impedance path between its emitter and collector terminals. This low impedance path appears across the input capacitor of the MOSFET 58, causing the capacitor to discharge extremely rapidly. Accordingly, MOSFET 58 also switches off in a short interval of time (about ten to fifty microseconds).

From the above discussion, it will be appreciated that the phototransistors 84 and 86 perform the function of ensuring that the MOSFETs 58, 70 switch off more rapidly than they switch on, thus ensuring that there will be no overlap of the application of power to loads 77 and 80.

Figure 3:
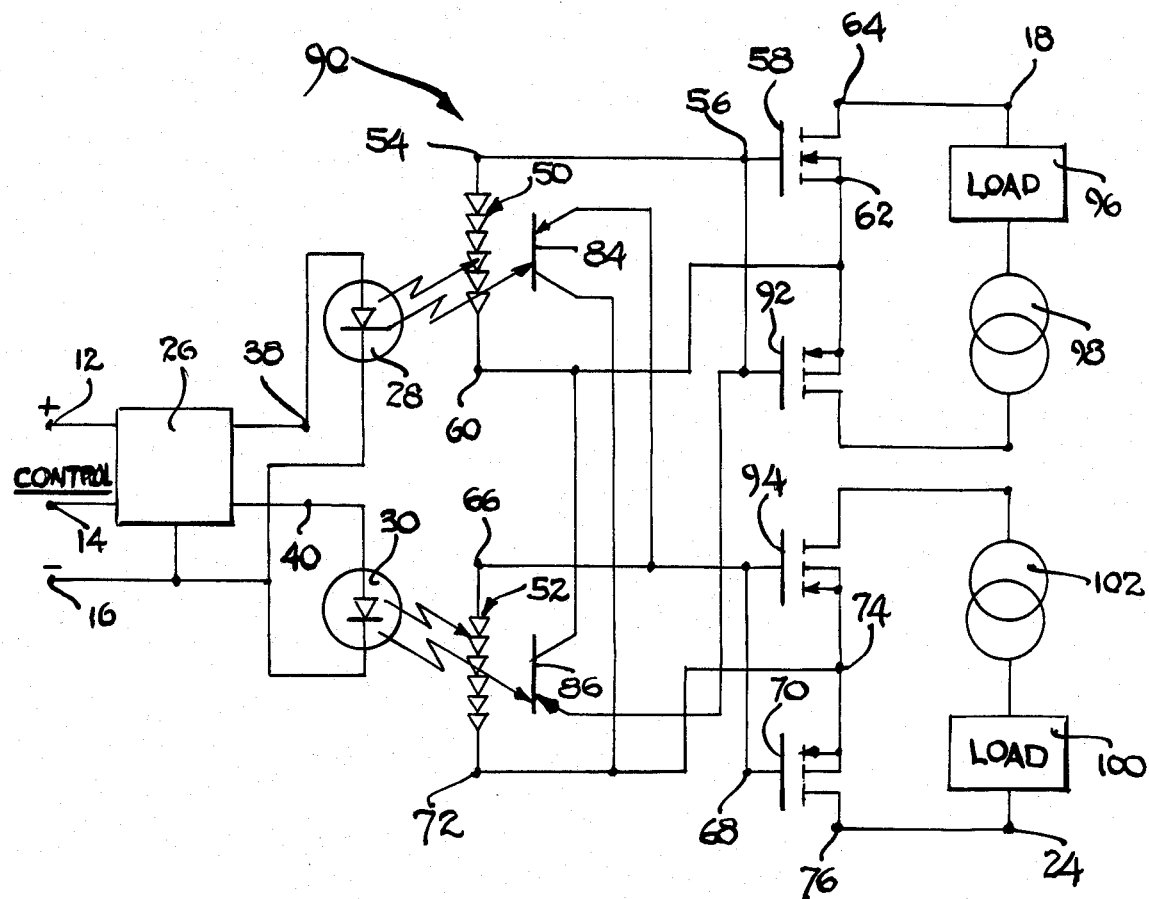
FIG. 3 is a schematic diagram showing a second embodiment of the invention designed to control the application of alternating current power to multiple loads.

FIG. 3 is a schematic diagram of a circuit 90 showing a second embodiment of the invention. The circuit 90 is substantially similar to the circuit 10, but employs a MOSFET 92 in combination with the MOSFET 58 to provide bidirectional conduction of current through the output terminals 18 and 20, and employs a MOSFET 94 in combination with the MOSFET 70 to provide bidirectional conduction of current through the output terminals 22 and 24. The differences between the circuit 90 and the circuit 10 are as follows. The MOSFET 92, which is similar in construction to the MOSFET 58, is connected with its source terminal in common with the source terminal 62 of the MOSFET 58. The drain terminal of the MOSFET 92 is, in turn, connected to the output terminal 20. The gate terminal of the MOSFET 92 is connected to the gate terminal 56 of the MOSFET 58.

The MOSFETs 58 and 92 provide a bidirectional current path between the output terminals 18 and 20 which enables the circuit 90 to control a load 96 powered by an alternating current power source 98. The voltage from the array 50 is used to simultaneously control the two power MOSFETs, while the phototransistor 86 is used to shunt, simultaneously, the input capacitors of the two devices.

The MOSFET 94, which is similar in construction to the MOSFET 70, is connected with its source terminal in common with the source terminal 74 of the MOSFET 70. The drain terminal of the MOSFET 94 is, in turn, connected to the output terminal 22. The gate terminal of the MOSFET 94 is connected to the gate terminal 68 of the MOSFET 70.

The MOSFETs 70 and 94 provide a bidirectional current path between the output terminals 22 and 24 which enables the circuit 90 to control a load 100 powered by an alternating current power source 102. The voltage from the array 52 is used to simultaneously control the two power MOSFETs, while the phototransistor 84 is used to shunt, simultaneously, the input capacitors of these two devices.

While the invention is disclosed and particular embodiments thereof are described in detail, it is not intended that the invention be limited solely to these embodiments. Many modifications will occur to those skilled in the art which are within the spirit and scope of the invention. It is thus intended that the invention be limited in scope only by the appended claims.

What is claimed is:

1. An electronic control circuit, comprising:
   first and second metal oxide field effect transistors (MOSFETs), each having gate, drain, and source terminals and an intrinsic input capacitor appearing between the respective gate and source terminals, and each MOSFET having a prescribed turn-on voltage level;
   first bias means for providing a first bias signal in response to the application of an input signal to the circuit, including a first array of series connected photodiodes, first light means for generating a first light in response to the application of the input signal, and means for coupling the first light to the photodiodes of the first array to generate the first bias signal;
   second bias means for providing a second bias signal in response to the absence of the input signal to the circuit, including a second array of series connected photodiodes, second light means for generating a second light in response to the absence of the input signal, and means for coupling the second light to the photodiodes of the second array to generate the second bias signal;
   first shunt means for providing a first current path in response to the application of the input signal to the circuit, including a first phototransistor and means for coupling the first light to the first phototransistor to bias it into conduction to establish the first current path;

second shunt means for providing a second current path in response to the absence of the input signal to the circuit, including a second phototransistor and means for coupling the second light to the second phototransistor to bias it into conduction to establish the second current path;

means for connecting the first bias means to the gate and source terminals of the first MOSFET so that the first bias signal serves to bias the first MOSFET into conduction in a first time interval established by the magnitude of the first bias means, and the magnitude of the first MOSFET input capacitor and turn-on voltage level;

means for connecting the second bias means to the gate and source terminals of the second MOSFET so that the second bias signal serves to bias the second MOSFET into conduction in a second time interval established by the magnitude of the second bias means and the magnitude of the second MOSFET input capacitor and turn-on voltage level;

means for connecting the first shunt means to the gate and source terminals of the second MOSFET so that upon the application of the input signal to the circuit the first current path discharges the second MOSFET input capacitor sufficiently rapidly to ensure that the second MOSFET is switched off within the first time interval, and thus before the first MOSFET is biased into conduction; and means for connecting the second shunt means to the gate and source terminals of the first MOSFET so that upon absence of the input signal to the circuit, the second current path discharges the first MOSFET input capacitor sufficiently rapidly to ensure that the first MOSFET is switched off within the second time interval, and thus before the second MOSFET is biased into conduction.

* * * * *